(12) United States Patent  
Cram et al.

(10) Patent No.: US 7,570,069 B2
(45) Date of Patent: Aug. 4, 2009

(54) RESILIENT CONTACT PROBES

(75) Inventors: Daniel P. Cram, Boise, ID (US); Scott L. Hoagland, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 11/269,085

(22) Filed: Nov. 7, 2005

(65) Prior Publication Data

US 2006/0043988 A1    Mar. 2, 2006

Related U.S. Application Data

(62) Division of application No. 10/834,526, filed on Apr. 28, 2004.

(51) Int. Cl.
*G01R 1/067* (2006.01)

(52) U.S. Cl. ...................................... 324/761; 324/754

(58) Field of Classification Search ................. 324/761, 324/754; 439/66
See application file for complete search history.

(56) References Cited

U.S. PATENT DOCUMENTS

| 3,676,776 | A | 7/1972 | Bauer et al. |
|---|---|---|---|
| 4,061,969 | A | 12/1977 | Dean |
| 4,200,351 | A | 4/1980 | Long et al. |
| 4,443,756 | A | 4/1984 | Lightbody et al. |
| 4,528,500 | A | 7/1985 | Lightbody et al. |
| 4,574,236 | A | 3/1986 | Hechtman |
| 4,633,176 | A | 12/1986 | Reimer |
| 4,724,383 | A | 2/1988 | Hart |
| 4,904,935 | A | 2/1990 | Calma et al. |
| 4,977,370 | A | 12/1990 | Andrews |
| 5,049,813 | A | 9/1991 | Van Loan et al. |
| 5,112,248 | A | 5/1992 | Kibblewhite et al. |
| 5,157,325 | A | 10/1992 | Murphy |

(Continued)

FOREIGN PATENT DOCUMENTS

EP    0 965 846 A2    12/1999

(Continued)

OTHER PUBLICATIONS

Pylon Pogo Contacts for Automatic Testing of Bare and Loaded PCB's, Coda Systems Limited, 19 pages, no date.

(Continued)

*Primary Examiner*—Ernest F Karlsen
(74) *Attorney, Agent, or Firm*—TraskBritt (57) ABSTRACT

Carriers comprising a carrier body having a plurality of openings holding a plurality of resilient contact probes are disclosed. A number of different embodiments for the resilient contact probes is also disclosed. The carriers of the present invention may be secured to an interface board (i.e., a printed circuit board (PCB)) and assembled with a substrate (e.g., a wafer having integrated circuitry thereon, a PCB, etc.). The resilient contact probes electrically contact the terminal pads of the interface board and the electrical contacts of the substrate to enable electrical testing of the substrate. The configuration of the resilient contact probes, in combination with the carrier body, enables preferential, high mechanical loading of the terminal pads with controlled, predictable loading of the electrical contacts. Methods of making and use are also disclosed, as are a plurality of embodiments of resilient contact probes.

6 Claims, 9 Drawing Sheets

U.S. PATENT DOCUMENTS

| | | |
|---|---|---|
| 5,345,170 A | 9/1994 | Schwindt et al. |
| 5,489,854 A | 2/1996 | Buck et al. |
| 5,493,230 A | 2/1996 | Swart et al. |
| 5,597,982 A | 1/1997 | Hiwada |
| 5,685,725 A | 11/1997 | Uratsuji |
| 5,744,977 A | 4/1998 | Cuautla |
| 5,791,914 A | 8/1998 | Loranger et al. |
| 6,005,401 A | 12/1999 | Nakata et al. |
| 6,005,405 A | 12/1999 | Slutz |
| 6,028,437 A | 2/2000 | Potter |
| 6,127,835 A | 10/2000 | Kocher et al. |
| 6,147,505 A | 11/2000 | Ott et al. |
| 6,175,243 B1 | 1/2001 | Kocher et al. |
| 6,330,744 B1 | 12/2001 | Doherty et al. |
| 6,512,389 B1 | 1/2003 | Kocher |
| 6,559,665 B1 | 5/2003 | Barabi |
| 6,570,399 B2 * | 5/2003 | Yeghiayan et al. .......... 324/761 |
| 6,667,628 B2 | 12/2003 | Ahrikencheikh et al. |
| 8,737,878 | 6/2004 | Kagami |
| 6,859,054 B1 | 2/2005 | Zhou et al. |
| 6,992,496 B2 * | 1/2006 | Winter et al. ............... 324/755 |
| 7,049,837 B2 | 5/2006 | Kasukabe et al. |
| 2002/0175695 A1 | 11/2002 | Ahmann et al. |
| 2003/0060092 A1 | 3/2003 | Johnson et al. |
| 2003/0099097 A1 | 5/2003 | Mok et al. |
| 2004/0140821 A1 | 7/2004 | Lee |

FOREIGN PATENT DOCUMENTS

WO      WO 01/04650 A1    1/2001

OTHER PUBLICATIONS

CODA-PIN Catalogue, Issue No. 12, Coda Systems Limited, 15 pages, no date.

\* cited by examiner

SECTION A-A

RESILIENT CONTACT PROBES

CROSS-REFERENCE TO RELATED APPLICATION

This application is a divisional of application Ser. No. 10/834,526, filed Apr. 28, 2004, pending.

BACKGROUND OF THE INVENTION

1. Field of the Invention

The present invention relates generally to testing of electrical devices such as semiconductor devices and printed circuit boards (PCBs). More particularly, the present invention relates to a carrier for holding resilient contact probes, various resilient contact probes, and related assemblies that may be used to perform wafer-level burn-in and testing of components on semiconductor wafers or other electrical devices.

2. State of the Art

It is advantageous in semiconductor processing to detect and screen out defective integrated circuits (ICs) as early as possible in the fabrication process. Many completed ICs fail within the first few months or weeks of use due to processing defects. Such a defect profile is commonly known as "infant mortality" and is clearly very undesirable and unacceptable for a customer purchasing an IC for use with other components in higher level packaging. To discover those circuits that are susceptible to infant mortality, IC fabrication processes conventionally include high temperature and cyclical temperature testing of ICs for extended periods of time before shipping products to a customer.

In a typical semiconductor fabrication process, a multiplicity of identical integrated circuits is formed as individual semiconductor dice on a semiconductor wafer or other bulk semiconductor substrate. Such a multiplicity of integrated circuits may number in the hundreds, or even thousands (such as in a 300 mm wafer) of individual semiconductor dice which are generally repeated across the wafer in a two-dimensional array. Once the integrated circuits are fabricated at semiconductor die locations on a semiconductor wafer, the semiconductor dice are then tested to determine which dice are at least nominally functional with such a determination performed, generally, by probe testing each die individually. The probing of individual semiconductor dice may be performed using probe equipment while the dice are still in wafer form. Currently, expensive probe equipment contacts each bond pad on an individual die with a separate probe. A typical probe test requires that each die be probed in order to determine the correct and acceptable functionality of each die.

Upon the identification of functional and nonfunctional semiconductor dice, the dice are then separated or singulated from the semiconductor wafer by way of a conventional dicing process, such as by using a wafer saw. Following singulation, functional dice may be packaged into separate integrated circuit packages or may undergo further processing prior to assembly with other dice and components in a higher-level assembly, which itself may be packaged. Once the semiconductor dice have been packaged or prepared for packaging within a higher level assembly, more thorough electrical testing is performed to determine whether each packaged integrated circuit properly performs the functionality for which it was designed. Upon successful package testing, integrated circuits may be sold or integrated into higher assemblies.

One system for testing individual dice is disclosed in U.S. Pat. No. 5,791,914 to Loranger et al. (hereinafter "the '914 Loranger Patent"). The '914 Loranger Patent discloses a socket-based electrical contactor. The socket based electrical contactor employs a two piece system for captivating a plurality of compression springs. A guide plate and a socket body captivates the plurality of compression springs that provide an electrical connection between a PCB and a semiconductor die to be tested.

While the socket-based electrical contactor of the '914 Loranger Patent enables the electrical testing of a semiconductor die, it suffers from several problems. For instance, the compression springs used to provide the electrical connection between the semiconductor die and the PCB exhibit very little lateral stability, resulting in inaccuracy when attempting to contact the terminal pads of the PCB and the bond pads of the semiconductor die. Furthermore, the same load is applied to the terminal pads of the PCB and the bond pads of the semiconductor die, which may result in a poor electrical connection therebetween. This is because the PCB, typically an interface test board, often has contaminated terminal pads with films and other contaminants thereon preventing a reliable electrical connection. Also, a two piece system is used to captivate the compression springs, adding additional parts and increasing cost and assembly time to the electrical contactor. Additionally, the socket based contactor is designed to test only individual semiconductor dice.

Multi-piece plate fixtures have been developed that hold spring contacts for testing circuit boards. For instance, U.S. Pat. No. 6,127,835 to Kocher et al. discloses such a fixture. U.S. Pat. No. 6,127,835 to Kocher et al. also purports to disclose employing a retainer sheet made of a rubber material such as latex, or a fine-mesh nylon material, which functions to hold the test probes in place in the assembled fixture.

Accordingly, there is a need for a system to test electrical devices such as integrated circuits and PCBs that employs resilient contact probes that have improved lateral stability and accuracy. Additionally, there is a need to enable mechanical loading of the terminal pads of the printed circuit board of the test apparatus and the electrical contacts of the electrical device tested to different levels or degrees to provide a reliable electrical connection therebetween. Furthermore, there is a need for a system to captivate resilient contact probes that is less costly and has fewer parts, making fabrication thereof less problematic. It is also desirable to be able to test an entire wafer in the test system as opposed to only individual semiconductor dice.

BRIEF SUMMARY OF THE INVENTION

The present invention, in a number of embodiments, includes carriers holding resilient contact probes, a variety of exemplary embodiments of the resilient contact probes, associated assemblies of carriers, probes and other components, and methods of using and making the resilient contact probes, carriers and assemblies. The present invention is particularly useful for the electrical testing of wafers having integrated circuits thereon (e.g., in wafer scale burn-in testing) and other electrical devices (e.g., printed circuit boards (PCBs)).

In one aspect of the present invention, an apparatus for making a temporary electrical connection with at least one electrical device is disclosed. The apparatus comprises a carrier body extending substantially in a plane and having a first surface, an opposing second surface, and a plurality of openings extending through the carrier body therebetween. The carrier body may comprise a unitary body. Resilient contact probes may be disposed within respective openings of the carrier body. An end region of each of the resilient contact probes may have a lateral dimension greater than a lateral dimension of at least an adjacent portion of the opening that the resilient contact probe is received within. The end region of each of the resilient contact probes interferes with the abutting first surface of the carrier body upon attempted longitudinal movement of the resilient carrier body in at least one direction so that the resilient contact probes are retained by the carrier body. The first surface of the carrier body may be covered with a compliant layer of a resilient, nonconductive material having apertures therethrough aligned with the openings, the apertures being of lesser lateral extent than a lateral extent of a portion of the resilient contact probe body passing therethrough, to secure the resilient contact probes in place on the carrier body during handling.

In accordance with the present invention, the carrier body may be secured to an interface board having a contact surface including a plurality of terminal pads thereon so that the contact surface faces the first surface of the carrier body and the end regions of the resilient contact probes are aligned, and in contact with the terminal pads, and are clamped between the carrier body and interface board, the optional compliant layer serving in this situation to compensate for nonplanarity of the first surface of the carrier body. A substrate, such as a semiconductor substrate or a PCB to be tested having a surface including a plurality of electrical contacts thereon, may then be placed over the carrier body so that the active surface faces the second surface of the carrier body. The design of the resilient contact probes, which are carried by the carrier body, and ends thereof remote from the second surface clamped between the first surface and the interface board, enables the substrate to be urged toward the interface board with the substrate and the carrier body bearing the resilient contact probes disposed therebetween with the end regions of the resilient contact probes highly and preferentially mechanically loading the respective terminal pads of the interface board by being clamped thereagainst while the electrical contacts of the substrate are precisely contacted and loaded by contact tips at the opposing ends of the resilient contact probes in a lesser, controlled manner due to selected longitudinal resiliency of the contact probe structure between the end regions and contact tips and lateral constraint of the contact tips to create a reliable electrical connection therebetween. Electrical testing of the substrate, such as burn-in testing, may then be performed as desired by applying electrical test signals from test equipment to the substrate through the interface board.

In another aspect of the present invention, various exemplary configurations for the resilient contact probes are disclosed. In an exemplary embodiment, a resilient contact probe includes a first end region, a second end region, and an intermediate region therebetween. The intermediate region comprises a compression spring having an active, longitudinally compressible portion. At least a portion of the first end region includes a lateral dimension greater than a diameter of the active, longitudinally compressible portion.

In another exemplary embodiment for the resilient contact probes, the first end region includes at least one coil having a lateral dimension greater than the diameter of the active, longitudinally compressible portion.

In another exemplary embodiment for the resilient contact probes, the compression spring comprises a dead, substantially incompressible portion within the intermediate region and proximate the second end region.

In yet another exemplary embodiment for the resilient contact probes, a housing may at least partially enclose the compression spring and may be secured to a portion thereof adjacent the first end region. A plunger body, having a stopper portion and a contact tip portion, is displaceable inside one end of the hollow interior of the housing. The stopper portion may be received within the housing and restrict the extent that the contact tip portion may extend longitudinally beyond the housing. The plunger body is longitudinally biased by a portion of the compression spring bearing against the stopper portion. In another exemplary embodiment, an end cap may be secured to an end of the housing proximate the first end region. In another exemplary embodiment, an annular ring may extend peripherally about the housing and be secured to an outer surface thereof proximate the first end region. In another exemplary embodiment, the first end region comprises at least one coil having a lateral extent greater than the diameter of the housing and located outside thereof.

Numerous features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The present invention, in a number of embodiments, includes carriers for holding resilient contact probes, a variety of exemplary embodiments of resilient contact probes, and associated assemblies thereof. The present invention is particularly useful for the electrical testing of wafers having integrated circuits thereon (e.g., as wafer burn-in testing) and other electrical devices (e.g., printed circuit boards (PCBs)). In the detailed description which follows, like features and elements in the several embodiments are identified in the drawings with the same or similar reference numerals for the convenience of the reader.

A brief description of an exemplary overall assembly of the electrical device test apparatus of the present invention will be discussed with reference to FIGS. 1A and 1B. A more detailed description of selected individual components of the assembly will follow with reference to FIGS. 2A–2C, 3A–3C, 4A–4C, 5A–5D, 6A–6D, and 7A–7D. Although the detailed description of the electrical device test apparatus of the present invention is described with respect to testing semiconductor wafers, the electrical device test apparatus is suitable and easily configurable for testing any electrical device. For example, PCBs may be tested instead of semiconductor wafers employing the electrical device test apparatus of the present invention. The electrical device test apparatus of the present invention may accommodate a variety of different electrical contacts on a substrate such as, for example, terminal pads or ribbon cables on a surface of a PCB that are each respectively contacted by a resilient contact probe to create a temporary electrical connection.

Figure 1A:
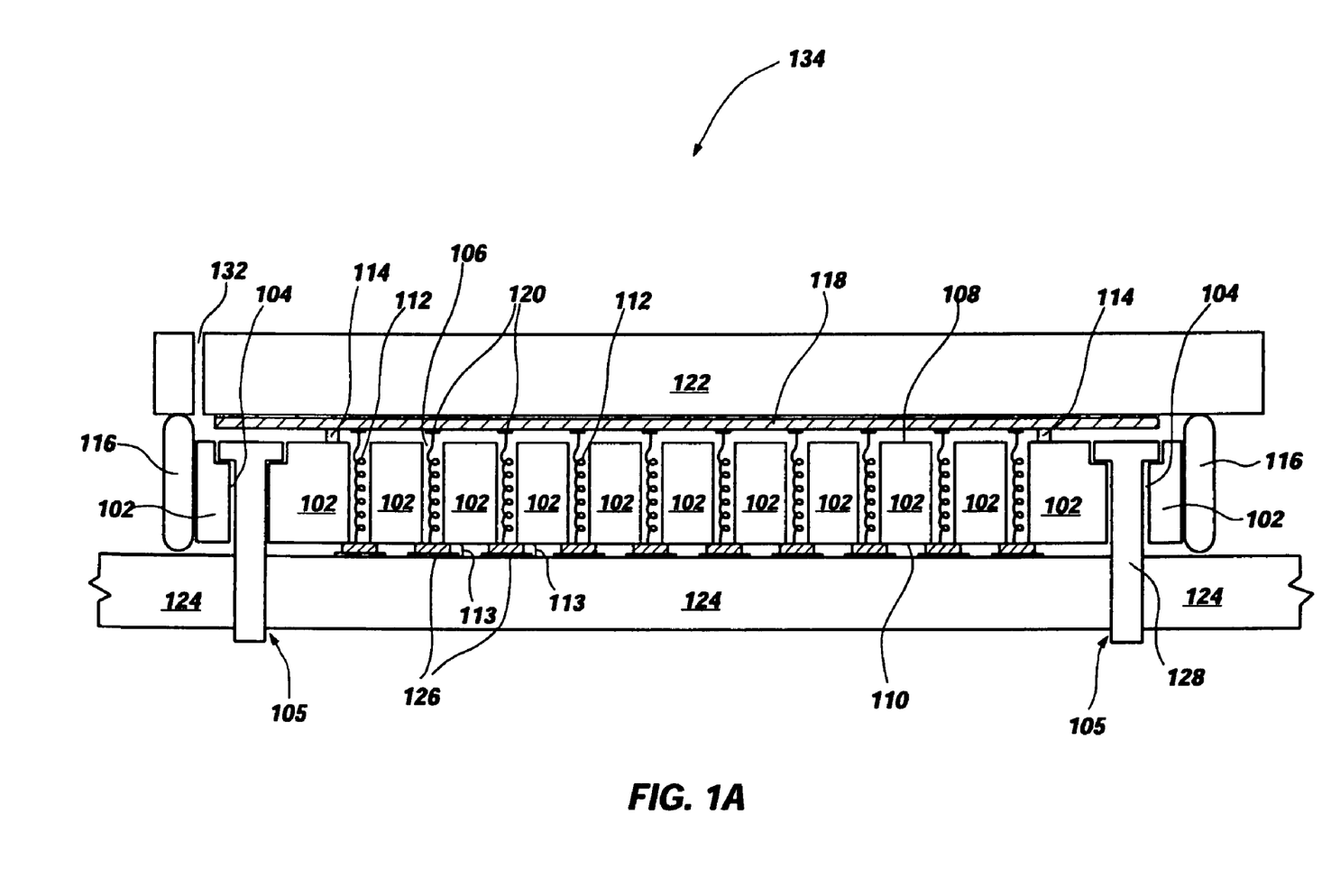
FIG. 1A is a schematic sectional view of an exemplary test assembly including a carrier and resilient contact probes of the present invention in a configuration preliminary to testing of a semiconductor wafer disposed therein.

Referring to FIG. 1A, assembly 134 is formed by inserting a plurality of resilient contact probes 112 into a like plurality of through holes 106 of a carrier 100 including carrier body 102. The carrier body 102 is depicted carrying a plurality of spacers 114 to provide a predetermined standoff distance between the carrier body 102 and a semiconductor wafer 118 to be tested. Spacers 114, which may be formed of, for example, a solder mask material, metal or plastic, are placed to coincide with areas of the semiconductor wafer 118 on which integrated circuits are not located, such as about the periphery of the wafer 118 and at boundaries or "streets" between semiconductor die locations on wafer 118. The semiconductor wafer 118 may be, without limitation, a bulk semiconductor substrate (e.g., a full or partial conventional wafer of semiconductor material, such as silicon, gallium arsenide, indium phosphide, or a silicon-on-insulator (SOI) type substrate, such as silicon-on-ceramic (SOC), silicon-on-glass (SOG), or silicon-on-sapphire (SOS), etc.) that includes a plurality of semiconductor dice thereon, and as used herein, the term "wafer" encompasses any and all of the foregoing structures.

With continued reference to FIG. 1A, the resilient contact probes 112 are inserted from the interface board side 110 of carrier body 102 to extend therethrough to a wafer side 108 thereof. Interface board contact end regions 113 of the resilient contact probes 112 may have portions of a lateral dimension, such as a diameter, larger than the diameters of portions of the through holes 106 adjacent to interface board side 110 of carrier body 102 and, thus, may be retained on the surface of the interface board side 110 of carrier body 102 when the resilient contact probes 112 are placed into through holes 106. Preferably, the resilient contact probes 112 are not preloaded to help prevent distortion of the carrier 100. Thus, when the resilient contact probes 112 are not preloaded, the carrier 100 and the resilient contact probes 112 are termed a "zero force system" in a neutral condition. The interface board 124 may then be placed over with the carrier body 102 by aligning the assembly holes 104 of the carrier body 102 with the assembly holes 105 in the interface board 124 and the two structures may then be fixed together with fastening elements 128, such as bolts, screws or other suitable fasteners. Some clearance to accommodate the laterally enlarged portions of interface board contact end regions 113 may be allowed between carrier body 102 and interface board 124, such as, for example, 100 µm. The clearance may be provided with shims or washers placed about fastening elements extending between carrier body 102 and interface board 124. Once the carrier body 102 and the interface board 124 are fixed together, the resilient contact probes 112 are thus captured therebetween. In other words, the presence of interface board contact end region 113 of each resilient contact probe 112 prevents the resilient contact probe 112 from being able to pass through its associated through hole 106 from the interface board side 110 to the wafer side 108 of carrier body 102 and the presence of the underlying interface board 124 prevents the resilient contact probe 112 from being able to fall out of carrier body 102 from the other direction. Thus, the interface board contact end region 113 of each resilient contact probe 112 is firmly disposed between interface board side 110 of carrier body 102 and interface board 124.

With continued reference to FIG. 1A, the semiconductor wafer 118 is placed on the wafer side 108 of the carrier body 102 such that bond pads 120 thereof are aligned with the resilient contact probes 112. Alignment may be performed using commercially available machine vision systems that have a "look down and up" capability to view both the bond pads 120 of the wafer 118 and the individual resilient contact probes 112 on the wafer side 108 of the carrier body 102. A resilient, annular (in the case of a conventional wafer test) seal element 116, such as an O-ring, is placed around the wafer 118 and the carrier body 102. It is noted that if a PCB is to be tested, instead of the conventional wafer 118 shown in FIGS. 1A and 1B, the seal element 116 may have a different geometry. Instead of having an annular shape, the seal element 116 may have any suitable shape that generally surrounds the PCB to be tested and the carrier body 102. A chuck 122 may be placed over the seal element 116 and the wafer 118 to bear against the edge of the resilient, annular seal element 116 and a back side of the wafer 118. A partial vacuum is then applied through vacuum port 132 of the chuck 122, the resilient, annular seal element 116 providing a seal between the interface board 124 and the chuck 122 to create a sealed chamber in interior region 117 containing semiconductor wafer 118 and carrier body 102 bearing resilient contact probes 112. The area of the interface board 124 contacted by the resilient, annular seal element 116 may be coated with a layer of metal (not shown) to provide a smooth contact surface for the adjacent edge of the resilient, annular seal element 116. The partial vacuum pulls the chuck 122 of the assembly 134 toward the interface board 124, causing the respective ends of the individual resilient contact probes 112 to contact the bond pads 120 of the wafer 118, the terminal pads 126 of the interface board 124 already being in contact with resilient contact probes 112. A sequence of electrical test signals may then be applied by conventional test equipment to the interface board 124 and communicated to the wafer 118 by the resilient contact probes 112.

The mechanical load (force) applied to the terminal pads 126 of the interface board 124 through the resilient contact probe 112 is proportional to the applied vacuum and may be of, for example, a magnitude of about 800 psi. When the vacuum is applied, the chuck 122, through wafer 118, spacers 114 and carrier body 102, may urge the interface board contact end regions 113 of the resilient contact probes 112 against the terminal pads 126 of the interface board 124 with additional force. Thus, very high loads (i.e., a high energy interface) may be applied to the terminal pads 126 of the interface board 124 by the interface board contact end regions 113 of the resilient contact probes 112 through the application of the vacuum, enabling a reliable electrical connection therebetween. Since the interface board 124 is subjected to repeated use, the terminal pads 126 are often deformed or covered with debris, contamination, or films (e.g., an oxide film). The high applied loads imposed on the carrier body 102 cause the interface board contact end regions 113 of resilient contact probes 112 to break through any debris, contamination, or films (e.g., an oxide film) present on the terminal pads 126 that would ordinarily prevent a reliable electrical connection therebetween. In contrast, the bond pads 120 of the wafer 118 are isolated from this loading due to the presence of spacers 114 and, instead are loaded to a significantly lesser degree by the contact tips of their associated resilient contact probes 112. It is unnecessary to apply as high a load to the relatively pristine surfaces of the bond pads 120 of the recently fabricated semiconductor wafer 118 and, in addition, such high loading may damage the relatively fragile bond pads 120, as well as the underlying circuitry. The load applied to the bond pads 120 of the wafer 118 is proportional to the internal spring constant of the resilient contact probe 112 (i.e., the amount of deflection of the compression spring of the resilient contact probe 112 upon application of the partial vacuum).

Figure 1B:
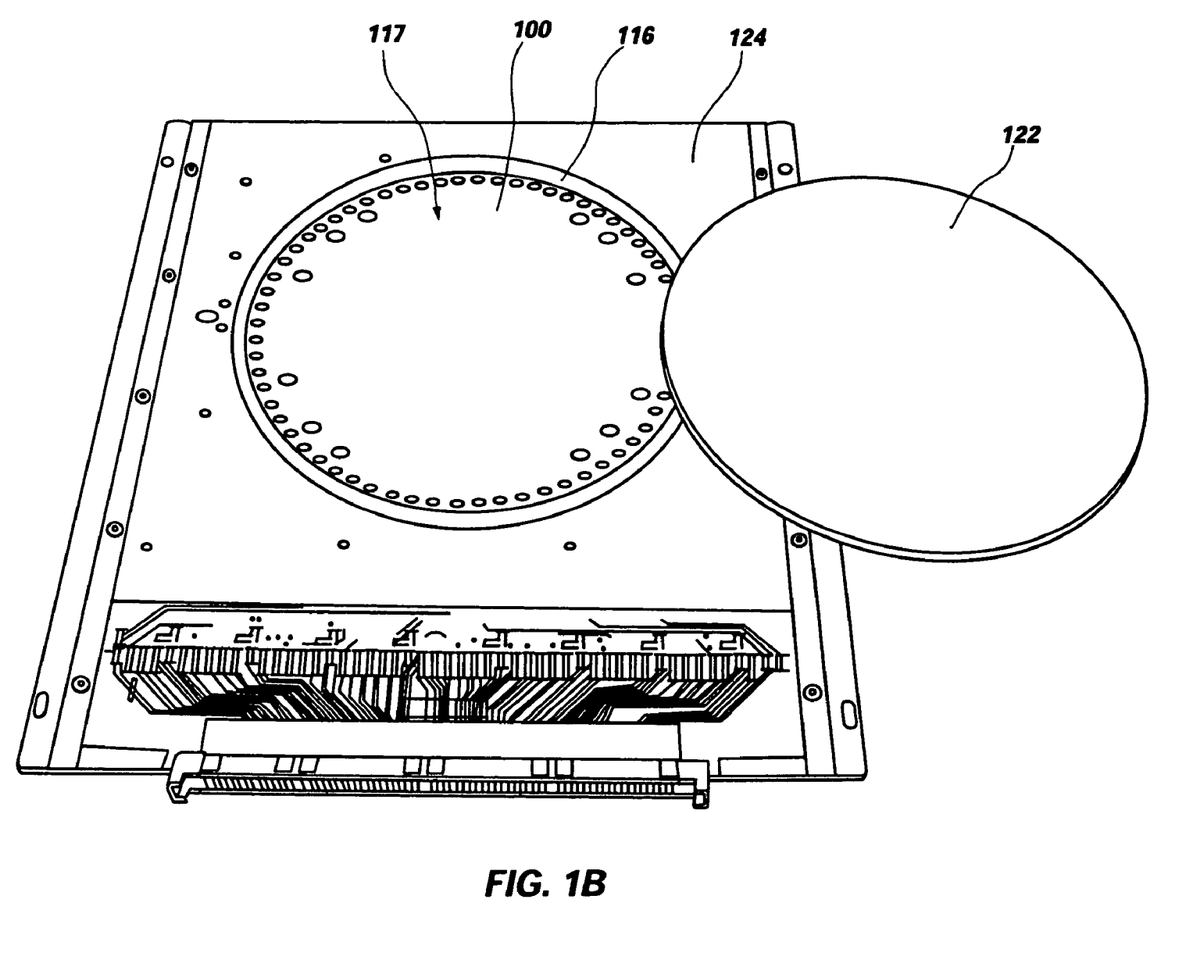
FIG. 1B is a perspective illustration of a partial assembly of FIG. 1A.

A perspective illustration of a portion of the assembly 134 is depicted in FIG. 1B. FIG. 1B illustrates the carrier 100 disposed on the active surface of the interface board 124 having terminal pads 126 (not shown, under carrier 100). The resilient, annular seal element 116 surrounds the carrier 100 and rests on the contact surface of the interface board 124. The chuck 122, dimensioned to cover the carrier 100 and surrounding resilient, annular seal element 116, is shown removed from the assembly 134 and to one side thereof. Although not shown in FIG. 1B, in operation of assembly 134, the wafer 118 fits within the interior region 117 defined by the resilient, annular seal element 116 and is covered by the chuck 122, as more clearly depicted in FIG. 1A.

Figure 2A:
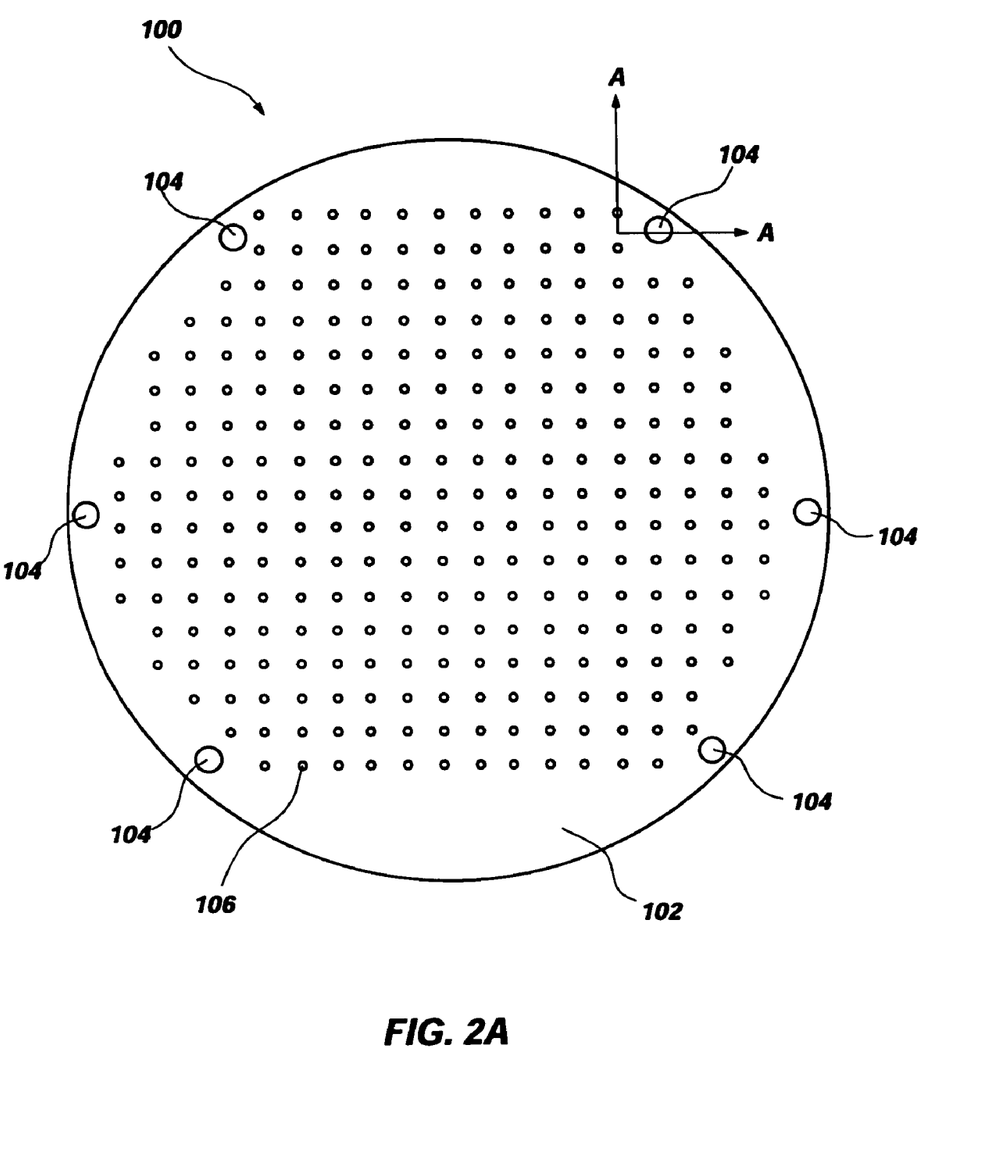
FIG. 2A is a plan view of an exemplary carrier for carrying a plurality of resilient contact probes according to the present invention.

The structure of carrier 100 for holding the plurality of resilient contact probes 112 will be discussed in more detail with reference to FIGS. 2A–2C. The carrier 100 of the present invention may comprise a single piece carrier that holds the plurality of resilient contact probes 112, making it relatively inexpensive and simple to fabricate. In FIG. 2A, the carrier 100 (i.e., a "keeper") is shown to comprise a one piece carrier body 102 including a plurality of through holes 106 for receiving resilient contact probes 112 therein, and a plurality of assembly holes 104 for use in securing carrier body 102 to interface board 124. A single piece carrier body 102 prevents problems with registration, alignment, or concentricity of through holes 106 in the carrier body 102 that would occur if the carrier body 102 was formed from multiple plates. The carrier body 102 may be formed from any organic, ceramic, or glass material that may be drilled to form through holes 106 and assembly holes 104. Silicon may be used for the material of the carrier body 102. However, if silicon is used for the material of the carrier body 102, the surfaces thereof including the interior of through holes 106 would need to be passivated as known in the art (such as by, for example, silicon nitride) to prevent current leakage from the resilient contact probes 112. Through holes 106 of the plurality are spaced apart and arranged so as to correspond to the locations of the bond pads 120 on the wafer 118 and the terminal pads 126 of the interface board 124 to be mated to the carrier 100. For example, an exemplary number of through holes 106 and corresponding resilient contact probes 112 may be about 11,890 to correspond to the number of bond pads 120 on the active surface of an eight inch wafer 118. Each of the plurality of assembly holes 104 that may be used to secure the carrier 100 to the interface board 124 is spaced apart circumferentially along the perimeter of the carrier body 102. Although not shown, additional holes may be spaced apart circumferentially along the perimeter of the carrier body 102 to allow for strain accommodation due to a mismatch of coefficients of thermal expansion (CTE) among the components of assembly 134 when the carrier body 102 is fixed to an interface board 124 in an assembly and is heated to an elevated temperature, such as during wafer burn-in. Also, additional holes (partial or through holes) may be selectively located in the interior of the carrier body 102 between some of the through holes 106 to enable aligning test fixtures for selectively testing specific resilient contact probes 112.

Figure 2B:
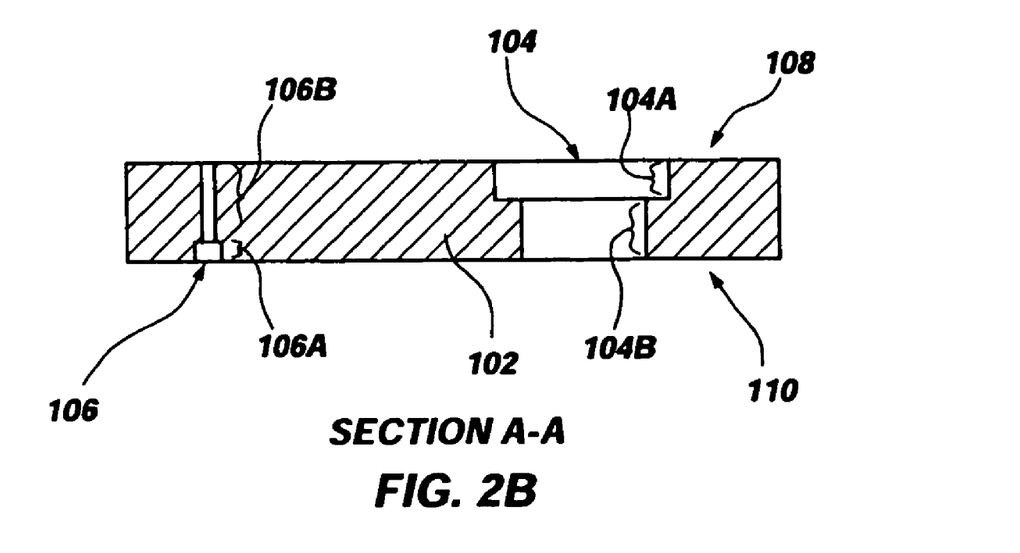
FIG. 2B is a sectional view taken of section A—A of FIG. 2A.

In FIG. 2B, a sectional view taken along line A—A of FIG. 2A is shown. FIG. 2B illustrates a sectional view of the carrier body 102 having a wafer side 108 that will abut the wafer 118. Interface board side 110 is the side of the carrier 100 that will abut the interface board 124. FIG. 2B depicts an exemplary geometry for the through holes 106 and the assembly holes 104. The through holes 106 are configured to receive the resilient contact-probes 112 and may each include a countersink portion 106A and an elongated portion 106B. Similarly, the assembly holes 104 are configured to receive a fastening element, such as a bolt, screw or other suitable fastener therethrough, and may include a countersink portion 104A to accommodate a head of the fastening element and an elongated portion 104B to accommodate a shaft thereof. The carrier 100 of the present invention may carry spacers 114 (shown in FIG. 1A) on the surface of the wafer side 108 to provide a predetermined amount of standoff between the wafer 118 and the surface of the wafer side 108 as depicted in FIG. 1A while transmitting force therethrough from chuck 122 and wafer 118 to carrier body 102. The spacers 114 may be formed, as noted above, by applying a solder mask material. The spacers 114 may also be formed by blanket electroplating or electroless deposition of a metal, such as copper or a copper alloy, followed by masking and etching to define the dimensions of the spacers 114 employing conventional photolithography techniques, or by selective deposition of metal through a patterned mask. The spacers 114 may also be formed by blanket deposition of a plastic material followed by patterning, or selective deposition thereof.

Figure 2C:
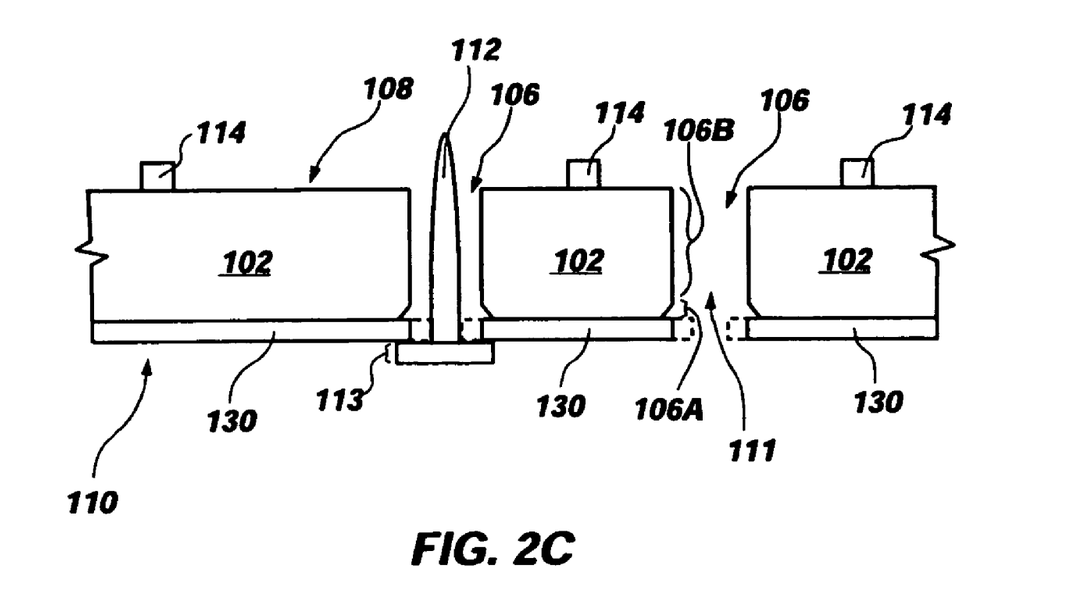
FIG. 2C is a sectional view of a carrier including a compliant layer on one side thereof.

Referring to FIG. 2C, in another exemplary embodiment, the carrier body 102 may include a compliant layer 130 coating the interface board side 110 thereof to retain the resilient contact probes 112 during fabrication and handling. The use of compliant layer 130 may also alleviate planarity problems with the surface of the interface board side 110 of carrier body 102 when carrier body 102 is disposed on the contact surface of interface board 124. A representative thickness for the compliant layer 130 maybe about 0.010 inch. In FIG. 2C, the carrier body 102 is depicted with the spacers 114 on the surface of the wafer side 108 to provide a predetermined amount of standoff between the wafer 118 and the surface of the wafer side 108 of carrier body 102. The compliant layer 130 has apertures 111 therethrough of smaller diameter or lateral extent than a lateral extent of resilient contact probes 112 and, thus secures the resilient contact probes 112 extending therethrough by a resilient interference fit therewith to retain them on the carrier body 102. As shown in FIG. 2C, the compliant layer 130 may extend over a portion of the countersink portion 106A of a through hole 106. The presence of compliant layer 130 also alleviates any problem with the interface board side 110 being nonplanar by deforming when assembled with the other components of assembly 134 and when the vacuum is applied to compress all of the components of assembly 134 together. Compliant layer 130 may be formed of any suitable, nonconductive material including, without limitation, silicone-based elastomers and fluorocarbon polymers. It is preferred that the compliant layer 130 be stable to temperatures up to 150° C. that may occur during wafer testing, and specifically during burn-in.

With continued reference to FIG. 2C, the compliant layer 130 maybe formed by spraying the compliant layer 130 on the interface board side 110 of the carrier body 102, followed by drilling the plurality of through holes 106. In such an instance, there will be no countersink portions 106A of through holes 106. The resilient contact probes 112 are then inserted into the through holes 106. The carrier 100 including the compliant layer 130 and the resilient contact probes 112 is heated to an elevated temperature sufficient to cause the compliant layer 130 to laterally expand over and toward the centers of the through holes 106 to bear against the resilient contact probes 112. Thus, resilient contact probes 112 may be retained on the carrier body 102 during handling and prior to assembly with interface board 124 by the compliant layer 130 laterally bearing against them. The compliant layer 130 may also be formed by first drilling the through holes 106 in the carrier body 102 (with countersink portions 106A, as desired) followed by spraying the compliant layer 130 on the interface board side 110 of the carrier body 102 or, preferably, adhesively bonding a preformed film comprising compliant layer 130 over the interface board side 110. Holes may then be punched in the compliant layer 130 that are aligned with, and have an undersized diameter with respect to, the countersink portions 106A of through holes 106. Thus, the compliant layer 130 may laterally extend over portions of through holes 106 and may bear against resilient contact probes 112 therein to retain them on the carrier body 102. Alternatively, upon heating, the compliant layer 130 may laterally extend toward the center of the through holes (shown by the dashed line) to bear against the resilient contact probe 112 therein. Countersink portions 106A may also provide clearance for longitudinal deflection of interface board contact end regions 113 of resilient contact probes 112 thereinto when carrier body 102 is assembled with interface board 124.

A number of different configurations may be used for the resilient contact probes 112 that are received by the plurality of through holes 106 in the carrier body 102. Various exemplary configurations for resilient contact probes 112 are labeled as resilient contact probes 112A, 112B, 112C, 112D, and 112E, shown in FIGS. 3A–3C, 4A–4C, 5A–5D, 6A–6D, and 7A–7D, respectively.

Figure 3A:
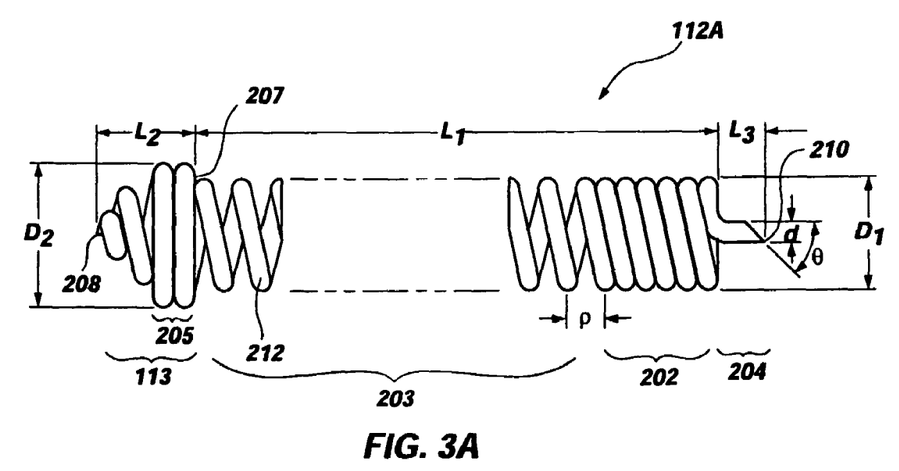
FIGS. 3A through 3C illustrate an exemplary resilient contact probe of the present invention that may be employed in conjunction with the carrier of FIGS. 2A–2C.
Figure 3B:
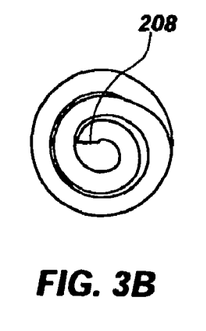
Figure 3C:
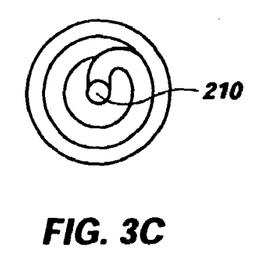

Referring to FIG. 3A, an exemplary configuration for resilient contact probe 112A is shown. Resilient contact probe 112A includes four regions: an interface board contact end region 113, an active region 203, a dead region 202, and a wafer contact end region 204, active region 203 and dead region 202 being located in an intermediate region of resilient contact probe 112A between interface board contact end region 113 and wafer contact end region 204. The interface board contact end region 113 includes a contact tip 208 formed as a "pigtail" of a plurality of coils of decreasing diameter that is configured to bear against the terminal pads 126 of the interface board 124 upon assembly with the interface board 124 and application of the partial vacuum, as more fully described with reference to FIG. 1A. A top view of the interface board contact end region 113 is shown in FIG. 3B. Two tightly wound coils 205 of the interface board contact end region 113 have an outer diameter ($D_2$) sized larger than the diameter of the through hole 106 of the carrier body 102 so that, upon insertion into the through hole 106, the resilient contact probe 112A is retained by the interface board side 110 of the carrier body 102. Thus, surface 207 of the two tightly wound coils 205 abuts the interface board side 110 of carrier body 102 upon assembly therewith. The "pigtail" type geometry of the contact tip 208 of interface board contact end region 113 not only provides some compliance and concentrates force on the adjacent terminal pad 126 with which it is aligned, but also enables accurate targeting of the terminal pads 126 and prevents step-offs or shorting due to inadvertently contacting a laterally adjacent terminal pad 126. The majority of the length of the resilient contact probe 112A comprises a compression spring 212 having a longitudinally compressible active region 203 comprising a plurality of coils of a diameter ($D_1$) and a pitch (P). Preferably, the compression spring 212 is not preloaded to help prevent distortion of the carrier 100. The compression spring 212 also includes a substantially longitudinally incompressible dead region 202 comprising a plurality of abutting coils that does not significantly contribute to the motive force of the compression spring 212. The dead region 202 increases the lateral stability of the resilient contact probe 112A within through hole 106 receiving same so that the contact tip 210 is not easily displaced during contacting of the wafer 118 from a lateral force against the contact tip 210. The length of the dead region 202 may be at least the same as the diameter of the elongated portion 106B of the through hole 106, and preferably greater. Thus, the presence of dead region 202 improves the positional accuracy of the contact tip 210 for contacting the bond pads 120 of the wafer 118. If a lateral force is applied to the contact tip 210, the dead region 202 contacts the side wall of the elongated portion 106B, preventing lateral motion of contact tip 210. The wafer contact end region 204 is defined by a length ($L_3$) and includes the contact tip 210 having a diameter (d) suitably sized and configured to contact the bond pads 120 of the wafer 118 upon assembly with wafer 118 and application of the partial vacuum as more fully described with reference to FIG. 1A. The contact tip 210 may have a variety of different geometries and is shown having a sharpened tip with an end surface lying at an angle θ relative to the center line of the resilient contact probe 112A. A top view of the wafer contact end region 204 is depicted in FIG. 3C.

By way of example, the compression spring 212 may be formed from a copper-beryllium alloy wire to have a spring rate of about 1.65 lbs per inch. Copper-beryllium is desirable as it exhibits a low bulk resistance. Such wire is commercially available from Brush Wellman and NGK. Stainless steel wire or music wire may also be used, but are less preferable as exhibiting a higher bulk resistance. The compression spring 212 may also be coated with 20 to 50 micro inches of cobalt hardened gold on top of a coating of 50 micro inches of nickel to increase the electrical conductivity thereof. Representative dimensions for the resilient contact probe 112A illustrated in FIG. 3A are $L_1$=133.00 mils, P=4.62, $L_2$=20.00 mils, $L_3$=7.0 mils, $D_1$=16.00 mils, $D_2$=21.00 mils, θ=450°, and d=3.10 mils. It is notable that a wire-only design for resilient contact probes 112 may be used to reduce pitch (spacing) between adjacent probes from current 0.4 mm pitch to 0.3 mm pitch or even smaller.

Figure 4A:
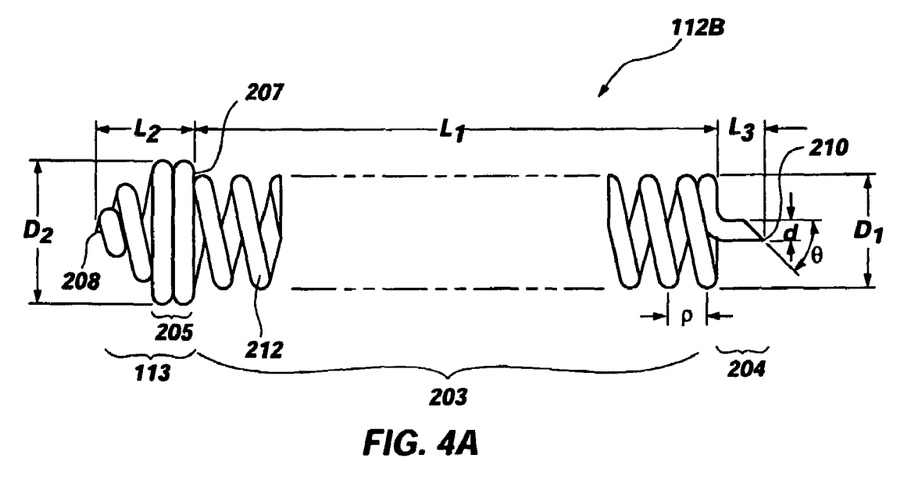
FIGS. 4A through 4C illustrate another exemplary resilient contact probe of the present invention that may be employed in conjunction with the carrier of FIGS. 2A–2C.
Figure 4B:
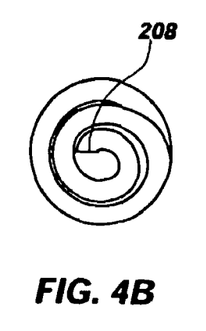
Figure 4C:
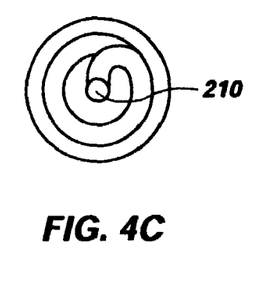

Referring to FIG. 4A, an exemplary configuration for resilient contact probe 112B is shown. Resilient contact probe 112B is substantially identical to the resilient contact probe 112A except that the compression spring 212 lacks the dead region 202 as part of the intermediate region. The interface board contact end region 113 includes a contact tip 208 that is configured to contact the terminal pads 126 of the interface board 124 upon assembly with the interface board 124 and application of the partial vacuum as more fully described with reference to FIG. 1A. A top view of the interface board contact end region 113 is shown in FIG. 4B. The outer diameter ($D_2$) of the interface board contact end region 113 is sized larger than the diameter of the through hole 106 of the carrier body 102 so that upon insertion into the through hole 106, the resilient contact probe 112B is retained by the interface board side 110 of the carrier body 102. In FIG. 4A, the interface board contact end region 113 is shown having two tightly wound coils 205 of a diameter ($D_2$) and serves to retain the resilient contact probe 112B upon insertion into the through hole 106. Thus, a surface 207 of the two tightly wound coils 205 abuts the interface board side 110. The majority of the length of the resilient contact probe 112B comprises a compression spring 212 having a diameter ($D_1$) and a pitch (P). Preferably, the compression spring 212 is not preloaded to help prevent distortion of the carrier 100. The wafer contact end region 204 is defined by a length ($L_3$) and includes a contact tip 210 having a diameter (d) that is configured to contact the bond pads 120 of the wafer 118 upon assembly with the wafer 118 and application of the partial vacuum as more fully described with reference to FIG. 1A. The contact tip 210 may have a variety of different geometries and is shown having a sharpened tip with an end surface lying at an angle θ relative to the center line of the resilient contact probe 112B. A top view of the wafer contact end region 204 is depicted in FIG. 4C. The materials for forming the various components of resilient contact probe 112B and representative dimensions thereof are the same as with the resilient contact probe 112A of FIGS. 3A–3C.

Figure 5A:
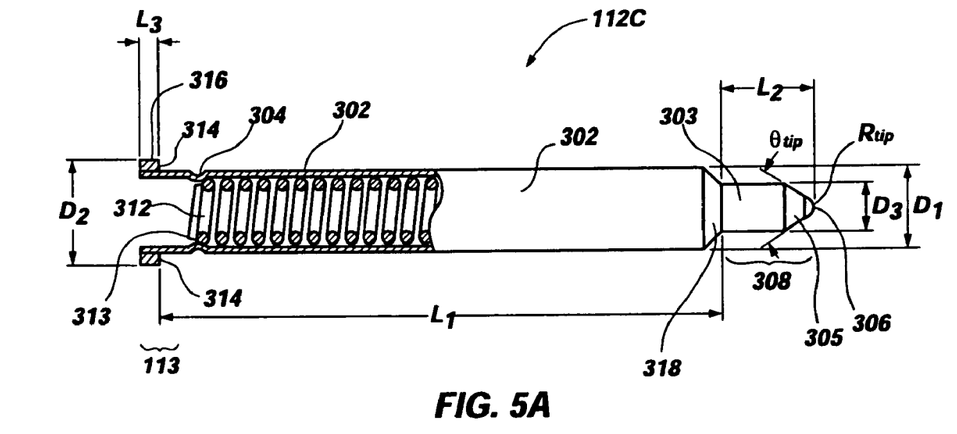
FIGS. 5A through 5D illustrate another exemplary resilient contact probe of the present invention that may be employed in conjunction with the carrier of FIGS. 2A–2C.
Figure 5B:
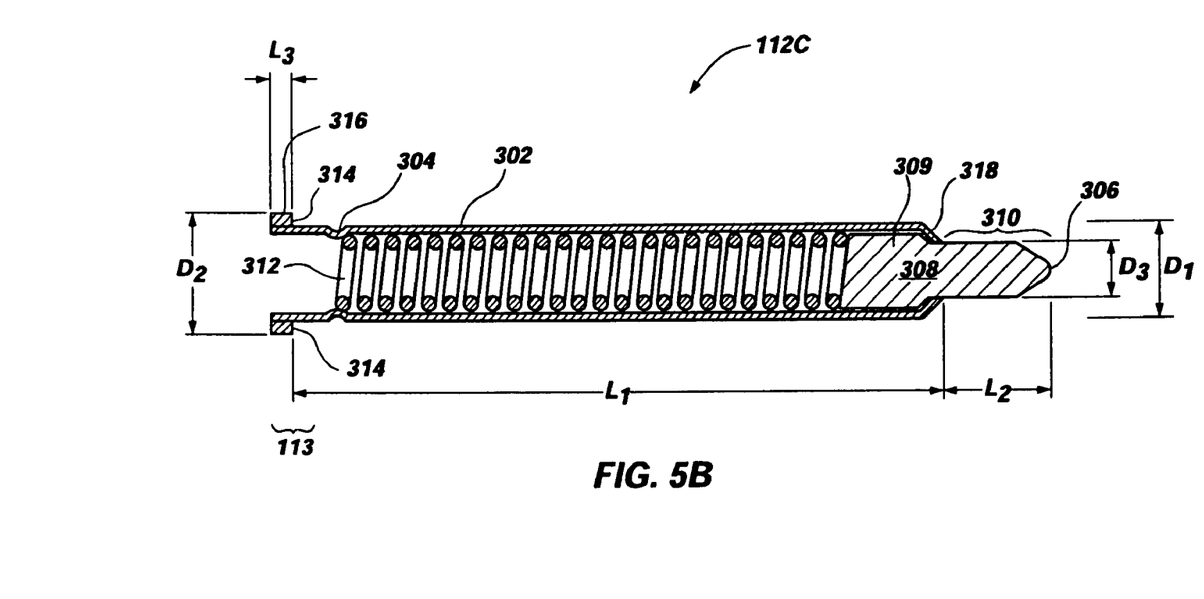
Figure 5C:
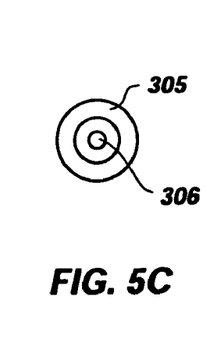

Referring to FIG. 5A, an exemplary configuration for resilient contact probe 112C is shown. Resilient contact probe 112C includes substantially tubular body 302, which is preferably formed from a drawn or extruded tube having a compression spring 312 dimensioned to fit therein in an intermediate region of resilient contact probe 112C. Preferably, the compression spring 312 is not preloaded to help prevent distortion of the carrier 100. One end 313 of the compression spring 312 is retained inside of the body 302 by roll crimping the wall of body 302 to form an annular, crimped portion 304 that restrains the end 313 from being able to be longitudinally displaced relative to the body 302 upon-compression of the compression spring 312. The geometry of the body 302 is defined by a major diameter ($D_1$), a minor diameter ($D_3$), and a length ($L_1$ and $L_3$). As more clearly shown in FIG. 5B, the body 302 tapers down to an opening having a minor diameter ($D_3$) at one end thereof that a portion of a solid plunger body 308 disposed within body 302 extends through. As depicted in FIG. 5B, the plunger body 308 includes an enlarged stopper portion 309 and an elongated portion 310. In FIGS. 5A and 5B, the stopper portion 309 is shown received by the hollow interior of body 302 with the elongated portion 310 extending therefrom a maximum length ($L_2$). The geometry of the elongated portion 310 is defined in part by a generally conically shaped end portion 305 formed at an angle ($\theta_{tip}$) relative to a portion 303. The contact tip 306 having a radius ($R_{tip}$) is sized and configured to contact the bond pads 120 of the wafer 118 upon assembly therewith and application of the partial vacuum to assembly 134, as more fully described with reference to FIG. 1A. The stopper portion 309, having a diameter greater than the minor diameter ($D_3$), prevents the plunger body 308 from being able to extend from the body 302 more than a length ($L_2$) due to the interference of tapered end 318 of the body 302 with the stopper portion 309. The plunger body 308 is also displaceable inside the hollow interior of body 302 so that a surface of the stopper portion 309 may contact the free end of the compression spring 312 upon displacement of plunger body 308 to longitudinally compress the compression spring 312 and to create an electrical path from the contact tip 306 to the opposing interface board contact end region 113. A top view of the plunger body 308 and the contact tip 306 is shown in FIG. 5C.

Figure 5D:
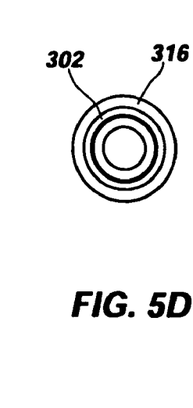

With continued reference to FIGS. 5A and 5B, the body 302 of the resilient contact probe 112C further includes a ring 316 on the interface board contact end region 113 thereof that is crimped or press fit thereto. The ring 316 increases the diameter ($D_1$) of the body 302 to a diameter ($D_2$). The diameter ($D_2$) is sized greater than the diameter of the through hole 106 of the carrier body 102 and serves to retain the resilient contact probe 112C on the interface board side 110 of the carrier body 102 upon insertion into the through hole 106. Thus, a surface 314 of the ring 316 abuts the interface board side 110. The interface board contact end region 113 is configured to contact the terminal pad 126 of the interface board 124 upon assembly with the interface board 124 and application of the partial vacuum, as more fully described with reference to FIG. 1A. A top view of the interface board contact end region 113 of the body 302 is illustrated in FIG. 5D.

By way of example, the compression spring 312 may be formed from a copper-beryllium alloy wire to have a spring rate of about 15 grams at 0.25 mm deflection. Copper-beryllium is desirable as it exhibits a low bulk resistance. Such wire is commercially available from Brush Wellman and NGK. Stainless steel wire or music wire may also be used, but are less preferable as exhibiting a higher bulk resistance. The compression spring 312 may also be coated with 20 to 50 micro inches of cobalt hardened gold on top of a coating of 50 micro inches of nickel to increase the electrical conductivity thereof. The body 302 may be formed from brass, the plunger body 308 may be formed from copper-beryllium alloys, steel, or tungsten, and the ring 316 may be formed from brass or copper-beryllium alloys, each of which may be coated with hardened gold or another suitable conductive coating to increase the electrical conductivity thereof. Representative dimensions for the resilient contact probe 112C illustrated in FIG. 5A are $L_1$=3.03 mm, $L_2$=0.50 mm, $L_3$=0.10 mm, $D_1$ 32 0.42 mm, $D_2$=0.54 mm, $D_3$=0.24 mm, $\theta_{tip}$=60°, and $R_{tip}$=0.05 mm.

Figure 6A:
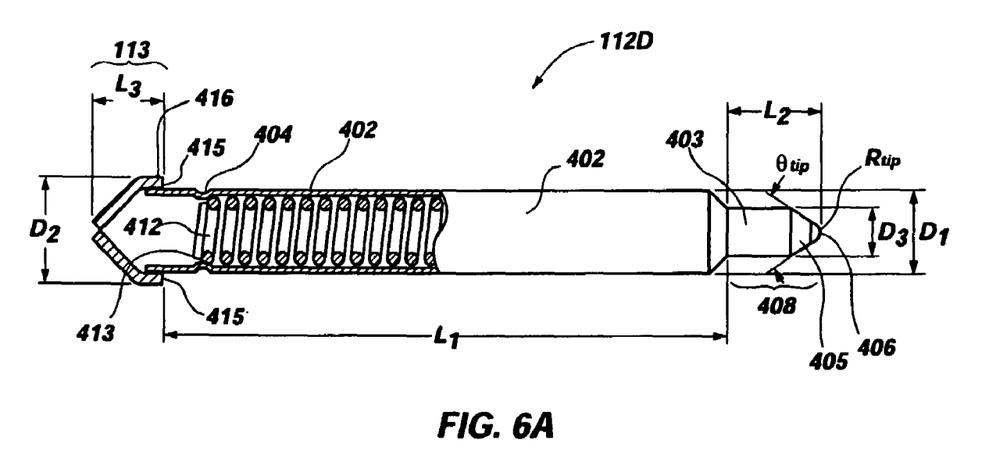
FIGS. 6A through 6D illustrate another exemplary resilient contact probe of the present invention that may be employed in conjunction with the carrier of FIGS. 2A–2C.
Figure 6B:
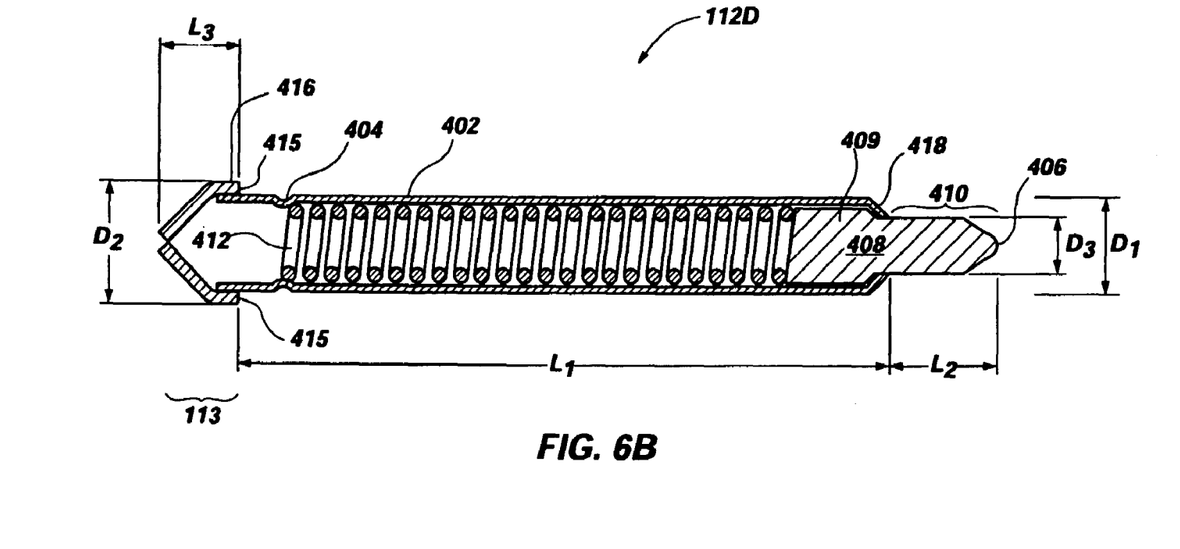
Figure 6C:
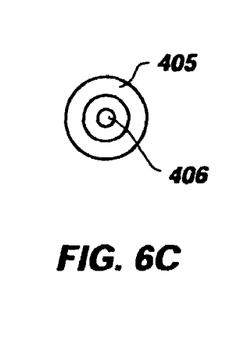

Referring to FIG. 6A, another exemplary configuration for resilient contact probe 112D is shown. Resilient contact probe 112D includes substantially tubular body 402 preferably formed from a drawn or extruded tube having a compression spring 412 dimensioned to fit therein in an intermediate region of resilient contact probe 112D. Preferably, the compression spring 412 is not preloaded to help prevent distortion of the carrier 100. One end 413 of the compression spring 412 is retained inside of the body 402 by roll crimping the wall of body 402 to form an annular, crimped portion 404 that restrains the end 413 from being able to be longitudinally displaced relative to the body 402 upon compression of the compression spring 412. The geometry of the body 402 is defined by a major diameter ($D_1$), a minor diameter ($D_2$), and a length ($L_1$). As more clearly shown in FIG. 6B, the body 402 tapers down to an opening having a minor diameter ($D_3$) at one end thereof that a portion of a solid plunger body 408 disposed within body 402 extends through. As depicted in FIG. 6B, the plunger body 408 includes an enlarged stopper portion 409 and an elongated portion 410. In FIGS. 6A and 6B, the stopper portion 409 is shown received by the hollow interior of body 402 with the elongated portion 410 extending therefrom a maximum length ($L_2$). The geometry of the elongated portion 410 is defined in part by a generally conically shaped end portion 405 formed at an angle ($\theta_{tip}$) relative to a portion 403. A contact tip 406 having a radius ($R_{tip}$) of the plunger body 408 is configured to contact the bond pads 120 of the wafer 118 upon assembly therewith and application of the partial vacuum, as more fully described with reference to FIG. 1A. The stopper portion 409, having a diameter greater than the minor diameter ($D_3$), prevents the plunger body 408 from being able to extend from the body 402 more than a length ($L_2$) due to the interference of tapered end 418 of the body 402 with the stopper portion 409. The plunger body 408 is also displaceable inside the hollow interior of body 402 so that a surface of the stopper portion 409 may contact the free end of the compression spring 412 upon displacement of plunger body 408 to longitudinally compress the compression spring 412 and to create an electrical path from the contact tip 406 to the opposing interface board contact end region 113. A top view of the plunger body 408 and contact tip 406 is shown in FIG. 6C.

Figure 6D:
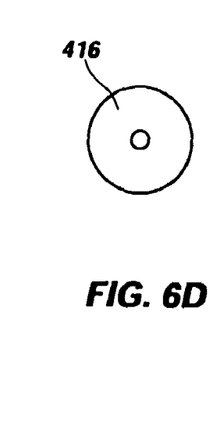

With continued reference to FIGS. 6A and 6B, the body 402 of the resilient contact probe 112D further includes an end cap 416 on the interface board contact end region 113 thereof that is crimped or press fit thereto. The end cap 416 has an outer diameter ($D_2$) that is greater than the major diameter ($D_1$) of the body 402. The diameter ($D_2$) is sized greater than the diameter of the through hole 106 of the carrier body 102 and serves to retain the resilient contact probe 112D on the interface board side 110 of the carrier body 102 upon insertion into the through hole 106 of the carrier body 102. Thus, a surface 415 of the end cap 416 abuts the interface board side 110. The end cap 416 is also configured to contact the terminal pads 126 of the interface board 124 upon assembly therewith and application of the partial vacuum as more fully described with reference to FIG. 1A. A top view of the interface board contact end region 113 of the body 402 is illustrated in FIG. 6D.

By way of example, the compression spring 412 may be formed from copper-beryllium alloy wire to have a spring rate of about 15 grams at 0.25 mm deflection. Copper-beryllium is desirable as it exhibits a low bulk resistance. Such wire is commercially available from Brush Wellman and NGK. Stainless steel wire or music wire may also be used, but are less preferable as exhibiting a higher bulk resistance. The compression spring 512 may also be coated with 20 to 50 micro inches of cobalt hardened gold on top of a coating of 50 micro inches of nickel to increase the electrical conductivity thereof.

The body 502 may be formed from brass and the plunger body 508 may be formed from copper-beryllium alloys, steel, or tungsten, each of which may be coated with hardened gold or another suitable conductive coating to increase the electrical conductivity thereof. Representative dimensions for the resilient contact probe 112E illustrated in FIG. 7A are $L_1$=3.03 mm, $L_2$=0.50 mm, $D_1$=0.42 mm, $D_2$=0.54 mm, $D_3$=0.24 mm, $\theta_{tip}$=60°, and $R_{tip}$=0.05 mm.

Figure 7A:
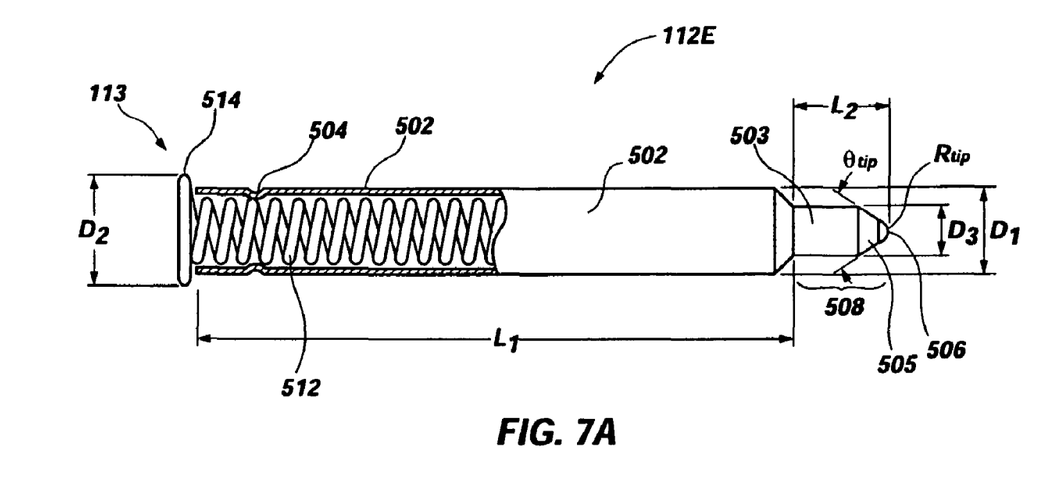
FIGS. 7A through 7D illustrate yet another exemplary resilient contact probe of the present invention that may be employed in conjunction with the carrier of FIGS. 2A–2C.
Figure 7B:
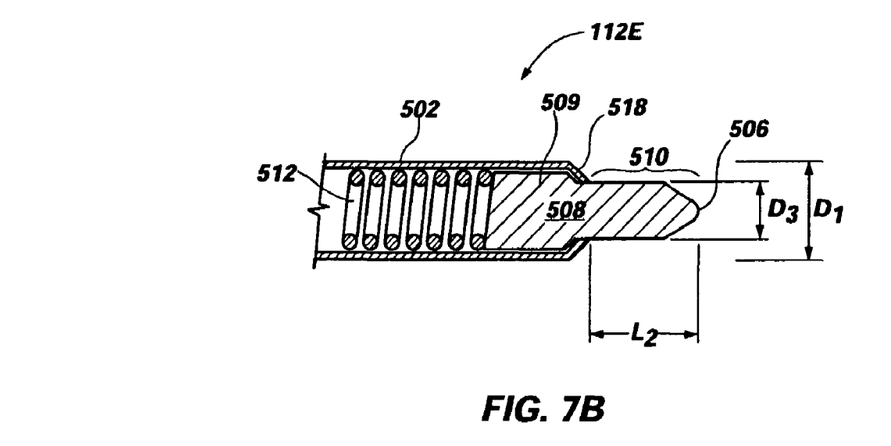
Figure 7C:
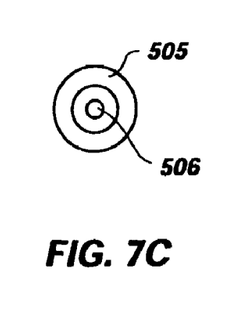

Referring to FIG. 7A, an exemplary configuration for resilient contact probe 112E is shown. Resilient contact probe 112E includes substantially tubular body 502 preferably formed from a drawn or extruded tube having a compression spring 512 dimensioned to fit therein in an intermediate region of resilient contact probe 112E. Preferably, the compression spring 512 is not preloaded to help prevent distortion of the carrier 100. A portion of the compression spring 512 proximate the interface board contact end region 113 is retained inside of the body 502 by roll crimping the body 502 to form an annular, crimped portion 504 that restrains a portion of the compression spring 512 from being able to be longitudinally displaced relative to the body 502 upon compression of the compression spring 512. The geometry of the body 502 is defined by a major diameter ($D_1$), a minor diameter ($D_3$), and a length ($L_1$). As more clearly shown in FIG. 7B, the body 502 tapers down to an opening having a minor diameter ($D_3$) at one end thereof that a portion of a solid plunger body 508 disposed within body 502 extends through. As depicted in FIG. 7B, the plunger body 508 includes an enlarged stopper portion 509 and an elongated portion 510. In FIG. 7B, a partial sectional view of the resilient contact probe 112E is shown with the stopper portion 509 received by the hollow interior of body 502 and the elongated portion 510 extending therefrom a maximum length ($L_2$). The geometry of the elongated portion 510 is defined in part by a generally conically shaped end portion 505 formed at an angle ($\theta_{tip}$) relative to a portion 503. A contact tip 506 having a radius ($R_{tip}$) of plunger body 508 is sized and configured to contact the bond pads 120 of the wafer 118 upon assembly therewith and application of the partial vacuum, as more fully described with reference to FIG. 1A. The stopper portion 509, having a diameter greater than the minor diameter ($D_3$), prevents the plunger body 508 from being able to extend from the body 502 more than a length ($L_2$) due to the interference of tapered end 518 of the body 502 with the stopper portion 509. The plunger body 508 is also displaceable inside the hollow interior of body 502 so that a surface of the stopper portion 509 may contact the free end of the compression spring 512 upon displacement of plunger body 508 to longitudinally compress the compression spring 512 and to create an electrical path from the contact tip 506 to the opposing interface board contact end region 113. A top view of the plunger body 508 and contact tip 506 is shown in FIG. 7C.

Figure 7D:
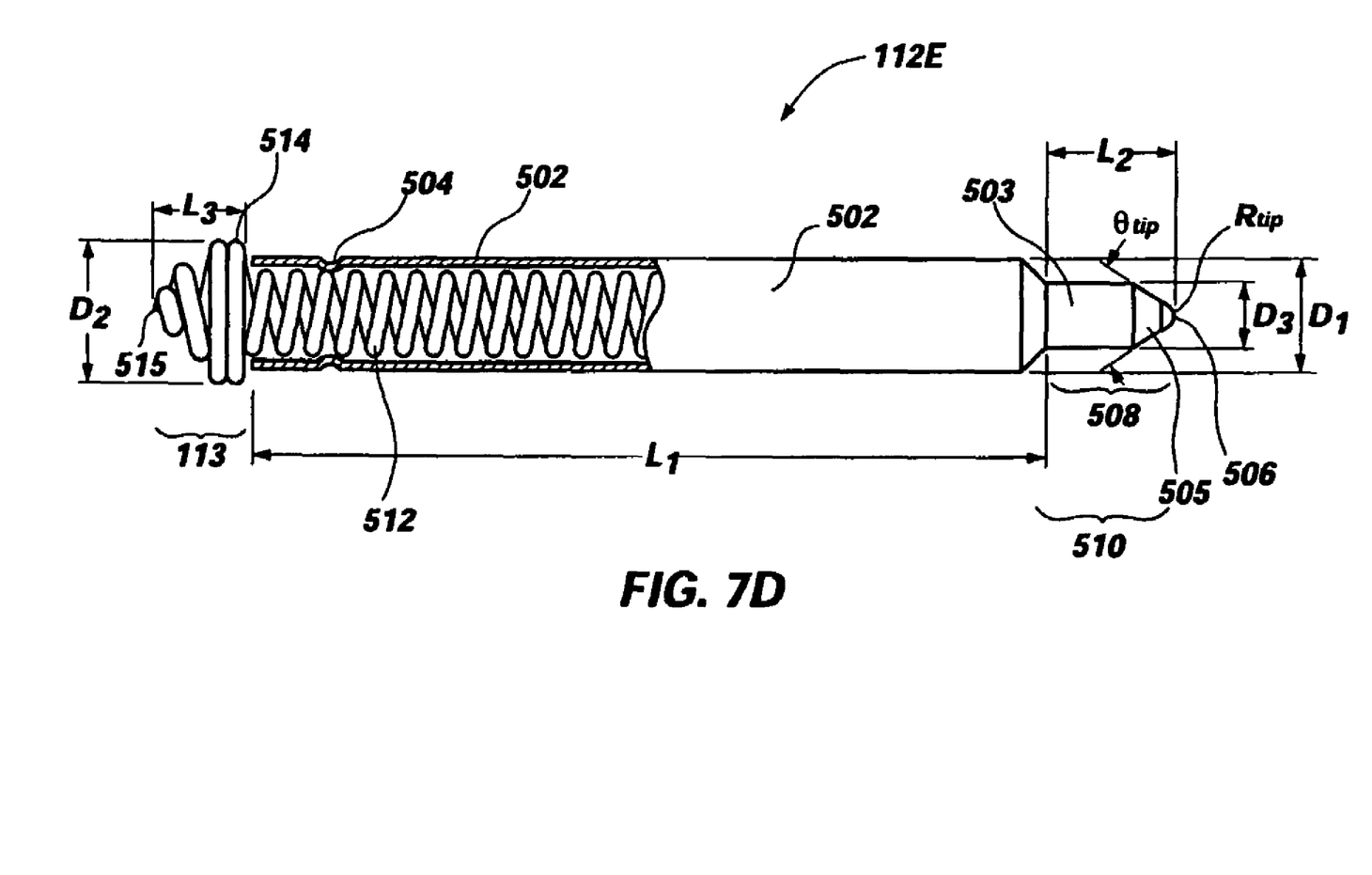

With continued reference to FIG. 7A, the compression spring 512 further includes at least one coil 514 located outside of the body 502 that has a diameter ($D_2$). The diameter ($D_2$) is greater than the diameter ($D_1$) of the body 502. The diameter ($D_2$) is sized greater than the diameter of the through hole 106 of the carrier body 102 and serves to retain the resilient contact probe 112E on the interface board side 110 of the carrier body 102 upon insertion into the through hole 106 of the carrier body 102. Thus, the at least one coil 514 abuts the interface board side 110. The at least one coil 514 having a diameter ($D_2$) is also configured to contact the terminal pads 126 of the interface board 124 upon assembly therewith and application of the partial vacuum, as more fully described with reference to FIG. 1A. The resilient contact probe 112E may also have a "pig tail" type coil at the interface board contact end region 113 having a contact tip 515 and a length ($L_3$) as shown in FIG. 7D. The interface board contact end region 113 (i.e., the "pig tail") may be identical to that shown and described with respect to the resilient contact probe 112A in FIGS. 3A-3C.

By way of example, the compression spring 512 may be formed from copper-beryllium alloy wire to have a spring rate of about 15 grams at 0.25 mm deflection. Copper beryllium Copper-beryllium is desirable as it exhibits a low bulk resistance. Such wire is commercially available from Brush Wellman and NGK. Stainless steel wire or music wire may also be used, but are less preferable as exhibiting a higher bulk resistance. The compression spring 512 may also be coated with 20 to 50 micro inches of cobalt hardened gold on top of a coating of 50 micro inches of nickel to increase the electrical conductivity thereof. The body 502 may be formed from brass and the plunger body 508 may be formed from copper-beryllium alloys, steel, or tungsten, each of which may be coated with hardened gold or another suitable conductive coating to increase the electrical conductivity thereof. Representative dimensions for the resilient contact probe 112E illustrated in FIG. 7A are $L_1$=3.03mm, $L_2$=0.50 mm, $D_1$=0.42 mm, $D_2$=0.54 mm, $D_3$=0.24 mm, $\theta_{tip}$=60°, and $R_{tip}$=0.05 mm.

Although the foregoing description contains many specifics, these are not to be construed as limiting the scope of the present invention, but merely as providing certain exemplary embodiments. Similarly, other embodiments of the invention may be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims are encompassed by the present invention.

What is claimed is:

1. A resilient contact probe comprising:

a first end region, a second end region, and an intermediate region therebetween, the intermediate region comprising a compression spring having an active, longitudinally compressible portion, wherein at least a portion of the first end region includes a lateral dimension greater than a diameter of the active, longitudinally compressible portion;

a substantially tubular housing at least partially enclosing the compression spring and secured to a portion thereof adjacent the first end region, the lateral dimension of the first end region greater than a diameter of the substantially tubular housing; and a plunger body of the second end region comprising a stopper portion received and restrained within the substantially tubular housing and a contact tip portion extending longitudinally beyond the substantially tubular housing, the plunger body longitudinally biased by a portion of the compression spring and adjacent a portion thereof.

2. The resilient contact probe of claim 1, wherein the first end region comprises at least one coil having the lateral dimension greater than the diameter of the active, longitudinally compressible portion.

3. The resilient contact probe of claim 2, wherein the first end region further comprises a pigtail extending distally from the at least one coil.

4. The resilient contact probe of claim 1, wherein the substantially tubular housing comprises:

an annular, crimped portion that bears against a portion of the compression spring adjacent the first end region.

5. The resilient contact probe of claim 1, wherein the first end region comprises at least one coil located outside of the substantially tubular housing, the at least one coil having a lateral extent greater than the diameter of the substantially tubular housing.

6. The resilient contact probe of claim 5, wherein the first end region further comprises a pigtail extending distally from the at least one coil.

* * * * *